United States Patent
Miyata et al.

(10) Patent No.: US 7,372,088 B2
(45) Date of Patent: May 13, 2008

(54) VERTICAL GATE SEMICONDUCTOR DEVICE AND METHOD FOR FABRICATING THE SAME

(75) Inventors: Satoe Miyata, Kyoto (JP); Shuji Mizokuchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/016,713

(22) Filed: Dec. 21, 2004

(65) Prior Publication Data

US 2005/0161734 A1 Jul. 28, 2005

(30) Foreign Application Priority Data

Jan. 27, 2004 (JP) .............................. 2004-018821

(51) Int. Cl.
*H01L 29/76* (2006.01)

(52) U.S. Cl. ............... 257/288; 257/368; 257/E27.091; 257/E29.201

(58) Field of Classification Search ........ 257/E27.091, 257/E29.201, E29.257, E29.26
See application file for complete search history.

(56) References Cited

U.S. PATENT DOCUMENTS

| | | | |
|---|---|---|---|
| 5,298,780 A | 3/1994 | Harada | |
| 6,084,264 A | 7/2000 | Darwish | |
| 6,168,996 B1 * | 1/2001 | Numazawa et al. | 438/270 |
| 6,174,773 B1 * | 1/2001 | Fujishima | 438/270 |
| 6,624,469 B1 | 9/2003 | Harada | |
| 6,670,658 B2 | 12/2003 | Hattori et al. | |
| 6,756,273 B2 | 6/2004 | Hadizad et al. | |
| 6,979,621 B2 | 12/2005 | Hshieh et al. | |
| 7,291,884 B2 | 11/2007 | Darwish et al. | |
| 2002/0060330 A1 | 5/2002 | Onishi et al. | |
| 2003/0003637 A1 | 1/2003 | Ninomiya | |

FOREIGN PATENT DOCUMENTS

| | | |
|---|---|---|
| JP | 06-053514 | 2/1994 |
| JP | 09-205204 | 8/1997 |
| JP | 2000-164869 | 6/2000 |
| JP | 2001-85685 | 3/2001 |
| JP | 2004-525500 | 8/2004 |
| JP | 2004-535087 | 11/2004 |
| JP | 2005-210047 | 8/2005 |

(Continued)

OTHER PUBLICATIONS

United States Office Action dated Jan. 4, 2007 for U.S. Appl. No. 11/030,945.

(Continued)

*Primary Examiner*—Scott B. Geyer
(74) *Attorney, Agent, or Firm*—McDermott Will & Emery LLP

(57) ABSTRACT

A source region is formed by performing ion implantation plural times to diffuse an impurity from the upper surface of a semiconductor region toward a region far dawn therefrom and to increase impurity concentration in the vicinity of the upper surface of the semiconductor region, whereby the source region and a gate electrode are overlapped with each other surely. Thus, offset between the gate and the source is prevented and an excellent ohmic contact is formed between a source electrode and the source region.

29 Claims, 11 Drawing Sheets

FOREIGN PATENT DOCUMENTS

WO          WO 02/27800 A2      4/2002

OTHER PUBLICATIONS

Japanese Office Action with English translation issued in corresponding Japanese Patent Application No. JP 2004-299698, dated Apr. 24, 2007.

United States Office Action in U.S. Appl. No. US 11/030,945, mailed Aug. 9, 2007.

Japanese Office Action, with English Translation, issued in Corresponding Japanese Patent Application No. 2004-038878, dated Nov. 6, 2007.

* cited by examiner

US 7,372,088 B2

VERTICAL GATE SEMICONDUCTOR DEVICE AND METHOD FOR FABRICATING THE SAME

CROSS REFERENCE TO RELATED APPLICATIONS

This Non-provisional application claims priority under 35 U.S.C. §119(a) on Patent Application No. 2004-018821 filed in Japan on Jan. 27, 2004, the entire contents of which are hereby incorporated by reference.

FIELD OF THE INVENTION

The present invention relates to a semiconductor device and a fabricating method thereof, and particularly relates to a MIS transistor having a trench gate structure (hereinafter referred to as trench gate MISFET) and a fabrication method thereof.

BACKGROUND ART

A so-called trench gate structure in which a trench is formed in a semiconductor substrate and a gate electrode is formed in the trench is applied to semiconductor devices such as IGBTs (Insulated Gate Bipolar Transistor), MISFETs, and is especially advantages in application to electric power sources (see Japanese Patent Application Laid Open Publication No. 2001-85685A, for example).

FIG. 12 is a section showing a semiconductor device of a conventional trench gate MISFET. In the trench gate MISFET shown in FIG. 12, a $N^-$-type drain layer 112 made of a N-type epitaxial layer and a P-type body region 113 are formed in this order on a $N^+$-type silicon substrate 111. Further, trenches 113 are formed in the P-type body region 113 so as to pass through the P-type body region 113 and so that each bottom thereof reaches the $N^-$-type drain layer 112. A pair of $N^+$-type source regions 114, each of which is in contact with a corresponding trench 116, are formed in the upper part of the P-type body region 113 interposed between the two trenches 116, and a $P^+$-type diffusion region 115 is formed at a part interposed between the pair of $N^+$-type source regions 114 in the upper part of the P-type body region 113. The $N^+$-type source regions 114 and the $P^+$-type diffusion region 115 are formed so as not to reach the $N^-$-type drain layer 112.

In each trench 116, a gate electrode 118 made of polysilicon is filled, with a gate insulating film 117 intervened. A cap oxide film 119 and an insulating film 120 made of PSG (Phospho Silicate Glass) are formed on the gate electrode 118. A source electrode film 121 is formed on the $N^+$-type source regions 114, the $P^+$-type diffusion region 115 and the insulating film 120.

SUMMARY OF THE INVENTION

In a power source MISFET having such a construction, when a voltage higher than a threshold voltage is applied between the gate electrode 118 and the $N^+$-type source region 114 while high voltage is applied between the source electrode film 121 and the $N^-$-type drain layer 112, an inversion layer is formed at an interface between the gate insulating film 117 and the P-type body region 113, with a result that a current flows from the $N^-$-type drain layer 112 to the $N^+$-type source region 114 through the thus formed inversion layer.

However, the conventional power source MISFET as described above involves the following disadvantages.

As shown in FIG. 12, the bottom (lower end) of the $N^+$-type source region 114 is formed so that the level thereof is below the upper surface (upper end) of the gate electrode 118 buried in each trench 116. In the case where ion implantation is performed deeply in order to form such a $N^+$-type source region 114, the impurity concentration at a part where the $N^+$-type source region 114 is in contact with the source electrode film 121 in the upper part of the side surface of the trench 116 is lowered, with a result that an ohmic contact is difficult to form between the source electrode film 121 and the $N^+$-type source region 114. Thus, source contact of insufficiently low resistance is formed.

The present invention has its object of providing a semiconductor device having a trench gate MISFET capable of forming a source contact of sufficiently low resistance by realizing an excellent ohmic contact between the source electrode film and the source region, and a method for fabricating it.

To attain the above object, a first semiconductor device according to the present invention includes: a semiconductor region; a first conductivity type drain region provided in a lower part of the semiconductor region; a second conductivity type body region provided on the drain region in the semiconductor region; a first conductivity type first source region provided on the body region in the semiconductor region; a first conductivity type second source region provided on the first source region in the semiconductor region so as to extend to an upper surface of the semiconductor region; a trench formed in the semiconductor region and reaching the drain region; a gate insulating film provided at least on a side surface of the trench; a gate electrode provided on the gate insulating film in the trench; and an insulating film covering an upper surface of the gate electrode in the trench.

In the first semiconductor device, the first source region is formed deep inside, so that the first source region and the gate electrode are overlapped with each other easily and offset between the gate and the source can be avoided. Also, the second source region is provided so that the impurity concentration thereof becomes high in the vicinity of the upper surface of the semiconductor region, with a result that, in the case where the source electrode is formed on the upper surface of the semiconductor region, an excellent ohmic contact can be formed between the source electrode and the second source region. With a synergetic effect of the above two effects, the resistance of the semiconductor device can be lowered compared with that of a conventional one.

In the first semiconductor device, the drain region may include: a first conductivity type high concentration drain region; and a first conductivity type low concentration drain region provided on the high concentration drain region.

The first semiconductor device may further include a source electrode provided above the second source region.

In this case, it is preferable that the source electrode is provided at a part above the second source region and on a part where the second source region is exposed at the side surface of the trench and a peak of impurity concentration of the second source region appears within a level range of a height of the source electrode provided on the side surface of the trench. In this arrangement, the impurity concentration of the second source region in contact with the source electrode is high, so that further excellent ohmic contact can be attained at the interface therebetween.

Further, in this case, a silicide film may be provided between the second source region and the source electrode.

With the silicide film therebetween, the resistance between the source region and the source electrode is further lowered.

In the first semiconductor device, it is preferable that an upper end of a part where the gate electrode is in contact with the gate insulating film is located upper than a boundary between the first source region and the body region. In this arrangement, the overlap amount between the part where the gate electrode is in contact with the gate insulating film and the first source region is increased, thereby enabling further lowering of the resistance.

In the first semiconductor device, it is preferable that an upper end of the insulating film is located lower than a peak of impurity concentration of the second source region. In this arrangement, in the case where the semiconductor region exposed at the side surface of the trench is silicided in the fabricating step thereafter, the silicide film is surely formed up to the level of the peak.

In the first semiconductor device, it is possible that a second conductivity type impurity region in contact with the body region is provided in a region located on respective sides of the first source region and the second source region in the semiconductor region and respective side surfaces of the first source region and the second source region are surrounded by the trench and the impurity region.

A second semiconductor device according to the present invention includes: a semiconductor region; a first conductivity type drain region provided in a lower part of the semiconductor region; a second conductivity type body region provided on the drain region in the semiconductor region; a first conductivity type source region provided on the body region in the semiconductor region so as to extend to an upper surface of the semiconductor region; a trench formed in the semiconductor region and reaching the drain region; a gate insulating film provide on at least a side surface of the trench; a gate electrode provided on the gate insulating film in the trench; and an insulating film covering an upper surface of the gate electrode in the trench, wherein an upper end of the insulating film is located lower than the upper surface of the semiconductor region, and an impurity concentration of a part of the source region from the upper end of the insulating film to the upper surface of the semiconductor region is equal to or larger than $1 \times 10^{20}$ atoms/cm$^3$.

In the second semiconductor device, the source region is provided so that the impurity concentration thereof becomes high in the vicinity of the upper surface of the semiconductor region. Therefore, in the case where the source electrode is formed on the upper surface of the semiconductor region, an excellent ohmic contact can be formed between the source electrode and the source region. Thus, a semiconductor device having a trench gate MISFET capable of realizing source contact of sufficiently low resistance can be provided.

In the second semiconductor device, the drain region may include: a first conductivity type high concentration drain region; and a first conductivity type low concentration drain region provided on the high concentration drain region.

The second semiconductor device may further include a source electrode provided above the second source region.

In this case, it is preferable that the source electrode is provided at a part above the source region and on a part where the source region is exposed at the side surface of the trench and a peak of impurity concentration of the source region appears within a level range of a height of the source electrode provided on the side surface of the trench. In this arrangement, the impurity concentration of the source region in contact with the source electrode is high, with a result that the ohmic contact at the interface therebetween becomes excellent.

Further, in this case, a silicide film may be provided between the source region and the source electrode. With the silicide film therebetween, the resistance between the source region and the source electrode is further lowered.

In the second semiconductor device, it is preferable that an upper end of a part where the gate electrode is in contact with the gate insulating film is located upper than a boundary between the source region and the body region. In this arrangement, the overlap amount between the part where the gate electrode is in contact with the gate insulating film and the source region is increased, thereby enabling further lowering of the resistance.

In the second semiconductor device, it is preferable that the upper end of the insulating film is located lower than a peak of impurity concentration of the source region. In this arrangement, in the case where the semiconductor region exposed at the side surface of the trench is silicided in the fabricating step thereafter, the silicide film is surely formed up to the level of the peak.

In the second semiconductor device, it is preferable that a second conductivity type impurity region in contact with the body region is provided in a region located on a side of the source region in the semiconductor region and a side surface of the source region is surrounded by the trench and the impurity region.

A first method for fabricating a semiconductor device according to the present invention includes the steps of: a step (a) of preparing a semiconductor region including a drain region and a second conductivity type body region provided on the drain region; a step (b) of forming a trench in the semiconductor region so as to reach the drain region; a step (c) of forming, after the step (b), a gate insulating film on at least a side surface of the trench where the semiconductor region is exposed; a step (d) of forming, after the step (c), a gate electrode on the gate insulating film in the trench; a step (e) of forming, after the step (d), an insulating film on the gate electrode in the trench; a step (f) of forming, after the step (b), a first conductivity type first source region on the body region by ion implantation of a first conductivity type impurity to the semiconductor region; a step (g) of forming, after the step (b), a first conductivity type second source region on the first source region so as to extend to an upper surface of the semiconductor region by ion implantation of a first conductivity type impurity to the semiconductor region.

In the first semiconductor device fabricating method, the second source region is formed more shallowly than the first source region. Hence, the impurity is diffused from the upper surface of the semiconductor region down to a part far therefrom by forming the first source region, and the impurity concentration in the vicinity of the upper surface of the semiconductor region is increased by forming the second source region. Accordingly, the first source region and the gate electrode are overlapped with each other surely, to prevent offset between the gate and the source. Moreover, a semiconductor device having an excellent ohmic contact between the source electrode provided on the second source region and the second source region can be obtained. With a synergetic effect of the above tow effects, a semiconductor device with further lower resistance can be obtained.

The first semiconductor device fabricating method may further include the step of: a step (h) of forming a source electrode above the second source region after the step (e), the step (f) and the step (g).

In this case, it is preferable that in the step (h), the source electrode is formed also on a part of the side surface of the trench where the second source region is exposed and a peak of impurity concentration of the second source region is arranged so as to appear in a level range of a height of the source electrode provided on the side surface of the trench. In so doing, the impurity concentration of the second source region in contact with the source electrode is increased, with a result that further excellent ohmic contact is attained at the interface therebetween.

Further, in this case, it is preferable to further include the step of forming a silicide film on the second source region after the step (e), the step (f) and the step (g) and before the step (h), wherein in step (h), the source electrode is formed on the silicide film. By formation of the silicide film, the resistance between the source region and the source electrode is further lowered.

In the first semiconductor device fabricating method, a first conductivity type high concentration region provided in a lower part of the semiconductor region and a first conductivity type low concentration drain region provided on the high concentration drain region may be prepared as the drain region in the step (a).

In the first semiconductor device fabricating method, it is preferable that in the step (f), the ion implantation is performed so that a boundary between the first source region and the body region is located lower than an upper end of a part where the gate electrode is in contact with the gate insulating film. By this ion implantation, the overlap amount between the part where the gate electrode is in contact with the gate insulating film and the first source region can be increased.

In the first semiconductor device fabricating method, it is preferable that in the step (g), the ion implantation is performed so that a peak of impurity concentration of the second source region appears at a part upper than an upper end of the insulating film. This is because the following reason. Namely: the silicide film is formed at the side surface of the trench (a part where the semiconductor region is exposed) above the insulating film; and in the case where the peak concentration is located higher than the upper end of the insulating film, the silicide film can be formed surely up to the level of the peak concentration.

The first semiconductor device fabricating method may further include the step of: a step (i) of forming, after the step (a), a second conductivity type impurity region in a region located on respective sides of the first source region and the second source region in the semiconductor region so as to extend from the upper surface of the semiconductor region to the body region, wherein respective side surfaces of the source region and the second source region are surrounded by the trench and the impurity region.

A second semiconductor device fabricating method includes the steps of: a step (a) of preparing a semiconductor region including a drain region and a second conductivity type body region provided on the drain region; a step (b) of forming a trench in the semiconductor region so as to reach the drain region; a step (c) of forming, after the step (b), a gate insulating film on at least a side surface of the trench where the semiconductor region is exposed; a step (d) of forming, after the step (c), a gate electrode on the gate insulating film in the trench; a step (e) of forming, after the step (d), an insulating film on the gate electrode in the trench; a step (j) of forming, after the step (b), a first conductivity type source region on the body region by ion implantation of a first conductivity type impurity at least three times to the semiconductor region, wherein an upper end of the insulating film is located lower than an upper surface of the semiconductor region, and impurity concentration of a part of the source region from the upper end of the insulating film to the upper surface of the semiconductor region is equal to or larger than $1 \times 10^{20}$ atoms/cm$^3$.

In the second semiconductor device fabricating method, ion implantation is performed three or more times for forming the source region. Therefore, the impurity can be diffused to a part of the semiconductor region downwardly apart from the upper surface thereof, and the impurity concentration in the vicinity of the upper surface of the semiconductor region can be increased. Hence, the source region and the gate electrode can be overlapped with each other surely, thereby preventing offset between the gate and the source. Further, a semiconductor device having an excellent ohmic contact between the source electrode provided on the source region and the source region can be obtained. With a synergetic effect of the above two effects, a semiconductor device with further lower resistance can be obtained.

The second semiconductor device fabricating method may further include the step of: a step (k) of forming a source electrode above the source region after the step (e) and the step (j).

In this case, it is preferable that in the step (k), the source electrode is formed also on a part of the side surface of the trench where the source region is exposed and a peak of impurity concentration of the source region is arranged so as to appear in a level range of a height of the electrode provided on the side surface of the trench. In so doing, the impurity concentration of the source region in contact with the source electrode is increased, with a result that a further excellent ohmic contact is attained at the interface therebetween.

Further, in this case, the step of: forming a silicide film on the source region after the step (e) and the step (j) and before the step (k) may be further included, wherein in step (k), the source electrode is formed on the silicide film. By formation of the silicide film, the resistance between the source region and the source electrode is further lowered.

In the second semiconductor device fabricating method, a first conductivity type high concentration region provided in a lower part of the semiconductor region and a first conductivity type low concentration drain region provided on the high concentration drain region may be prepared as the drain region in the step (a).

In the second semiconductor device fabricating method, it is preferable that in the step (j), the ion implantation is performed so that a boundary between the source region and the body region is located lower than an upper end of a part where the gate electrode is in contact with the gate insulating film. By this ion implantation, the overlap amount between the part where the gate electrode is in contact with the gate insulating film and the source region can be increased.

In the second semiconductor device fabricating method, it is preferable that in the step (j), the ion implantation is performed so that a peak of impurity concentration of the source region appears at a part upper than an upper end of the insulating film. This is because the following reason. Namely: the silicide film is formed at the side surface of the trench (a part where the semiconductor region is exposed) above the insulating film; and in the case where the peak concentration is located higher than the upper end of the insulating film, the silicide film can be formed surely up to the level of the peak concentration.

The second semiconductor device fabricating method may further include the step of a step (l) of forming, after the step (a), a second conductivity type impurity region in a region located on a side of the source region in the semiconductor region so as to extend from then upper surface of the semiconductor region to the body region, wherein a side surface of the source region is surrounded by the trench and the impurity region.

As described above, according to the present invention, an excellent ohmic contact can be formed between the source region and the silicide film to be a part of the source electrode while avoiding offset between the gate and the source, thereby obtaining a trench gate MISEFT with low resistance.

DETAILED DESCRIPTION OF THE INVENTION

First Embodiment

A semiconductor device according to the first embodiment of the present invention and a fabricating method thereof will be described below with reference to drawing.

Figure 1A:
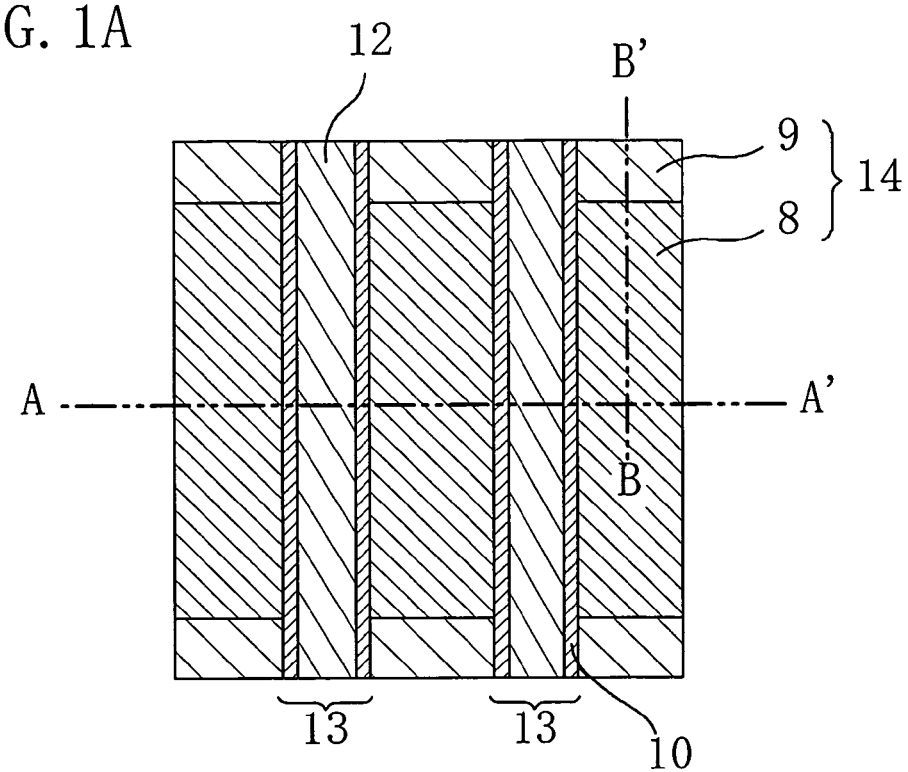
FIG. 1A is a schematic plan view showing a semiconductor device according to first and second embodiments of the present invention.
Figure 1B:
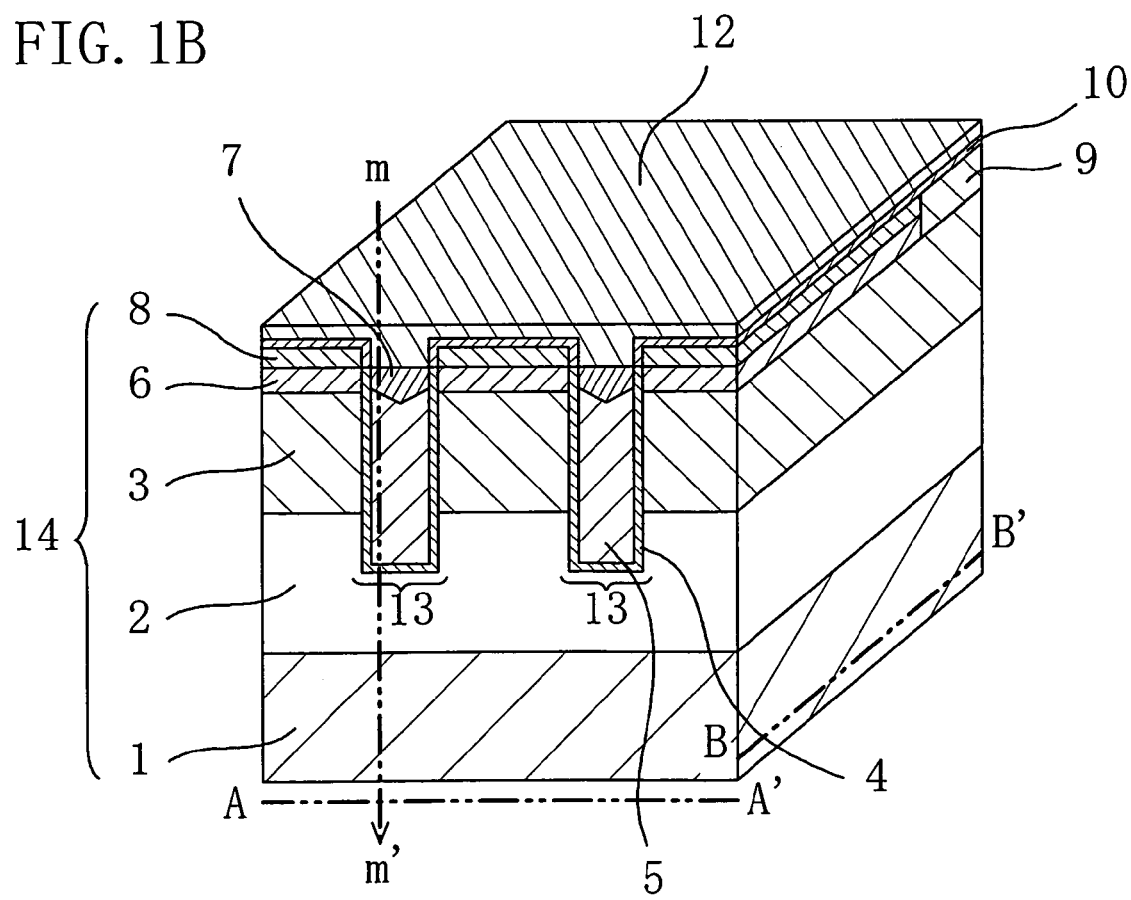
FIG. 1B is a schematic perspective view of a section taken along a line A-A in FIG. 1A when viewed in perspective from B to B'.

First, a trench gate MISFET according to the first embodiment of the present invention will be described. FIG. 1A is a schematic plan view showing a semiconductor device according to the present embodiment, and FIG. 1B is a schematic perspective view of a section taken along a line A-A in FIG. 1A when viewed in perspective from B to B'. Wherein, a silicide film 10 and a source electrode film 12 on the surface of a semiconductor region 14 in FIG. 1B are not shown in FIG. 1A for the sake of easy understanding.

In the semiconductor device of the present embodiment, as shown in FIG. 1A, a plurality of trenches 13 are formed along a direction of the line B-B' in the semiconductor region 14 with regular intervals left. A source electrode film 12 is filled in the upper part of each trench 13, and the silicide film 10 is formed between the source electrode film 12 and the semiconductor region 14 (a high concentration N-type diffusion region 9 and a second high concentration P-type source region 8) on the plane shown in FIG. 1A. The high concentration N-type diffusion region 9 is formed on both sides of the second high concentration P-type source region 8. In detail, the second high concentration P-type source region 8 is in contact at two sides thereof with corresponding two trenches 13 that face each other and is in contact at the other two sides thereof with corresponding two high concentration N-type diffusion regions 9 that face each other. It is noted that the construction shown in FIG. 1A may be formed repeatedly in the direction along the line A-A' and/or the line B-B'.

Further, as shown in FIG. 1B, the semiconductor region 14 includes: a high concentration P-type drain region 1; a low concentration P-type drain region 2 formed on the high concentration P-type drain region 1 and made of an epitaxial layer; a N-type body region 3 provided on the low concentration P-type drain region 2; a first high concentration P-type source region 6 provided in a source formation region on the N-type body region 3; the second high concentration P-type source region 8 provided on the fist high concentration P-type source region 6; and the high concentration N-type diffusion region 9 provided in a body contact formation region on the N-type body region 3. Wherein, the second high concentration P-type source region 8 is formed so as to be in contact with the upper surface of the first high concentration P-type source region 6 entirely. It is noted that the semiconductor region 14 may be, for example, a silicon substrate or may be composed of a silicon substrate and an epitaxial layer formed thereon. Also, in the present description, each high concentration P-type drain region means a region of which impurity concentration is over about $1 \times 10^{19}$ atoms/cm$^3$ and each low concentration P-type drain region means a region of which impurity concentration is below about $5 \times 10^{16}$ atoms/cm$^3$.

Each trench 13 passes through the second high concentration P-type source region 8, the first high concentration P-type source region 6 and the N-type body region 3 and reaches a part at a predetermined depth of the low concentration P-type drain region 2 in the semiconductor region 14. In the body contact formation region, each trench 13, which extends along the direction of the line B-B', passes through the high concentration N-type diffusion region 9 and the N-type body region 3 and reaches a part at a predetermined depth of the low concentration P-type drain region 2. The trenches 13 are formed at regular intervals left, and at least the N-type body region 3, the first high concentration P-type source region 6, the second high concentration P-type source region 8 and the high concentration N-type diffusion region 9 are formed in a region interposed between respective two trenches 13.

In each trench 13, a gate electrode 5 made of polysilicon is formed with a gate insulating film 4 intervened. The gate electrode 5 is ranged from the level corresponding to a part of the low concentration P-type drain region 2 under the N-type body region 3 to the level corresponding to a part of the first high concentration P-type source region 6 on the N-type body region 3 in each trench 13.

On the gate electrode 5 in each trench 13, a buried insulating film 7 is provided so as to cap the gate electrode 5. The level of the end part of the bottom of the buried insulating film 7, that is, a part thereof in contact with the gate insulating film 4 is located upper than the level of the interface of the first high concentration P-type source region 6 and the N-type body region 3.

A silicide film 10 is provided on the upper surface regions of the second high concentration P-type region 8 and of the high concentration N-type diffusion region 9 and on a part of the side surface of each trench 13 which is located upper than the buried insulating film 7. On the silicide film 10, a source electrode film 12 is formed so as to fill a part above the buried insulating film 7 in each trench 13.

In the above construction, the first high concentration P-type source region 6 and the second high concentration P-type source region 8 have respective peak concentrations at different depths. Specifically, the lower end (bottom surface) of the first high concentration P-type source region 6 is located lower than the upper end of the gate electrode 5, and the peak of the impurity concentration of the second high concentration P-type source region 8 is located upper than the upper end (upper surface) of the buried insulating film 7 formed on the gate electrode 5.

In the semiconductor device of the present embodiment, the first high concentration P-type source region 6 is provide deep inside, and therefore, the first high concentration P-type source region 6 and the gate electrode 5 overlap with each other easily, with a result of avoiding offset between the source and the gate. Further, the provision of the second high concentration P-type source region 8 increases the impurity concentration in the vicinity of the upper surface of the semiconductor region 14, so that an excellent ohmic contact can be formed between the source electrode film 12 to be connected electrically with the silicide film 10 and the second high concentration P-type source region 8. With a synergetic effect of the above two effects, a semiconductor device can be obtained which has a lower resistance than a conventional one.

Figure 2A:
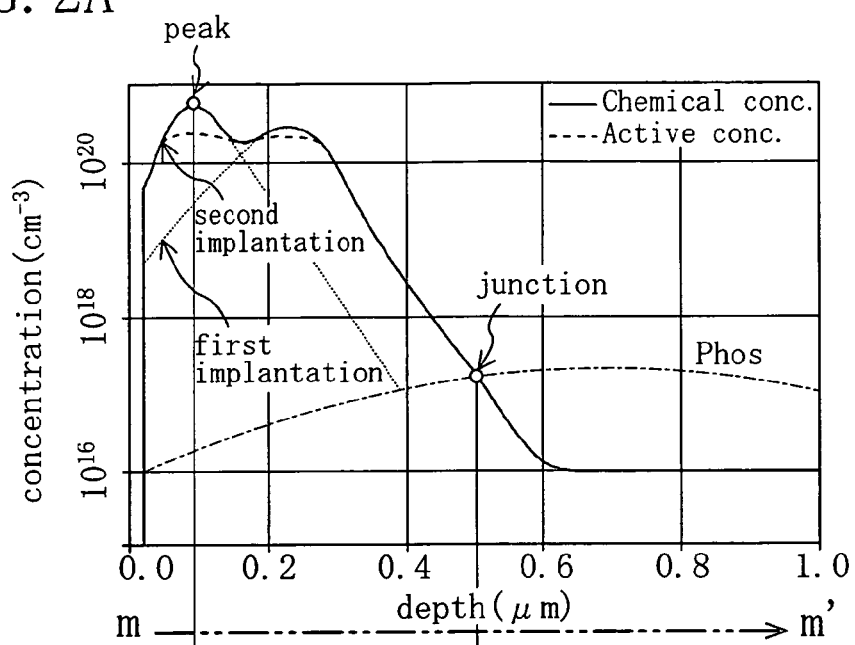
FIG. 2A is a graph illustrating impurity distribution (first embodiment) in a line m-m' in FIG. 1B.
Figure 2B:
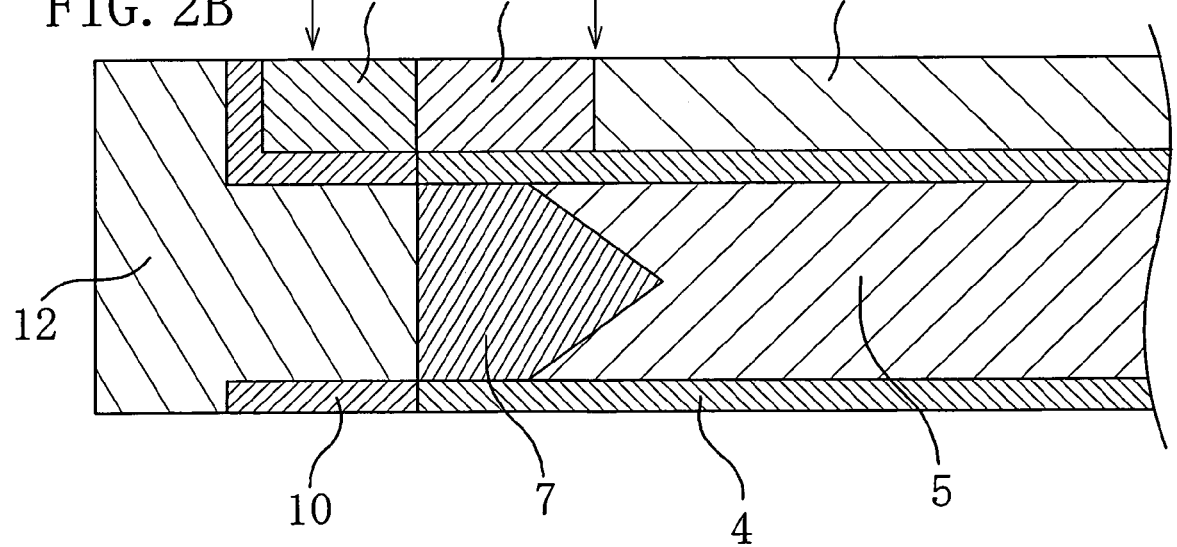
FIG. 2B is a section showing, in an enlarged scale, a structure in the vicinity of the line m-m' in FIG. 1B.

FIG. 2A shows impurity distribution along the line m-m' in FIG. 1B, and FIG. 2B is a section in an enraged scale showing a structure in the vicinity of the line m-m' in FIG. 1B. Wherein, Chemical conc. (solid line) indicates a concentration of an actually implanted P-type impurity (boron), Active conc. (bold broken line) indicates a concentration of an impurity to be activated by annealing out of implanted impurities, and Phos (dot-and-dash line) indicates a concentration of a N-type impurity (phosphorous) that has been implanted before the boron implantation.

As shown in FIG. 2A, in the present embodiment, in order to avoid high resistance caused due to offset between the source and the drain, the junction point between the first high concentration P-type source region 6 and the N-type body region 3 is controlled by setting conditions of first implantation for forming the first high concentration P-type source region 6, and the impurity distribution is controlled so that the concentration peak appears at the depth where the silicide film 10 is formed on the inner side surface of each trench 13 by setting conditions of second implantation for forming the second high concentration P-type source region 8. By these setting, source contact with low resistance can be attained. It is noted that no influence is involved even if the first implantation and the second implantation are performed in inverse order. Further, the silicide film 10 is formed between the source electrode film 12, which is a wiring electrode film, and the semiconductor region 14 in the present embodiment but may not be formed in the present invention.

Further, as shown in FIG. 2A, it is preferable to set the impurity concentration of the surface portion of the semiconductor region 14 including the second high concentration P-type source region 8 to be about $1 \times 10^{20}$ atoms/cm$^3$. By this setting, an excellent ohmic contact can be attained between the source electrode film 12 and the source region.

A method for fabricating the semiconductor device of the present embodiment will be described next. FIG. 3A to FIG. 3C and FIG. 4A to FIG. 4C are sections respectively showing the fabrication steps of the semiconductor device according to the present embodiment.

Figure 3A:
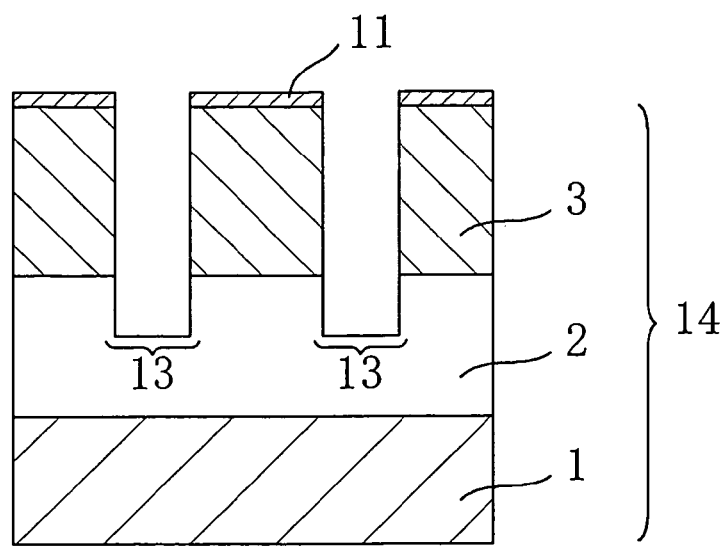
FIG. 3A to FIG. 3C are sections respectively showing steps of a fabricating method of the semiconductor device according to the first embodiment of the present invention.

First, in the step shown in FIG. 3A, after a high concentration P-type drain region 1 is formed on a semiconductor substrate (not shown), P-type epitaxial layer (not shown) of 5 μm in thickness is formed on the high concentration P-type drain region 1 by epitaxial growth. Then, phosphorous, which is a N-type impurity, is implanted to the P-type epitaxial layer under the conditions of implantation energy at 500 KeV and dose amount of $1 \times 10^{13}$ ions/cm$^2$ to form a N-type body region 3 of 1.1 μm in diffusion depth (at junction point between drain and body) in an upper part of the P-type epitaxial layer. Thus, a semiconductor region 14 is formed in which a low concentration P-type drain region 2 made of the P-type epitaxial layer is formed between the high concentration P-type drain region 1 and the N-type body region 3. Thereafter, a mask material 11 having an opening at a part corresponding to a trench formation region is formed on the substrate by photolithography and dry etching. As the mask material 11, an oxide film, a lamination film composed of a lower oxide film and an upper nitride film, a lamination film composed of a lower oxide film, an interlaid silicon film and an upper nitride film or the like may be used. Then, dry etching is performed using the mask material 11 as a mask to form a trench of 1.3 to 1.5 nm in depth which passes through the N-type body region 3 and reaches a part at a predetermined depth of the high concentration P-type drain region 2. Wherein, the trench 13 is formed so that the bottom thereof is located between the upper surface and the lower surface of the low concentration P-type drain region 2 and does not reach the upper surface of the high concentration P-type drain region 1.

Figure 3B:
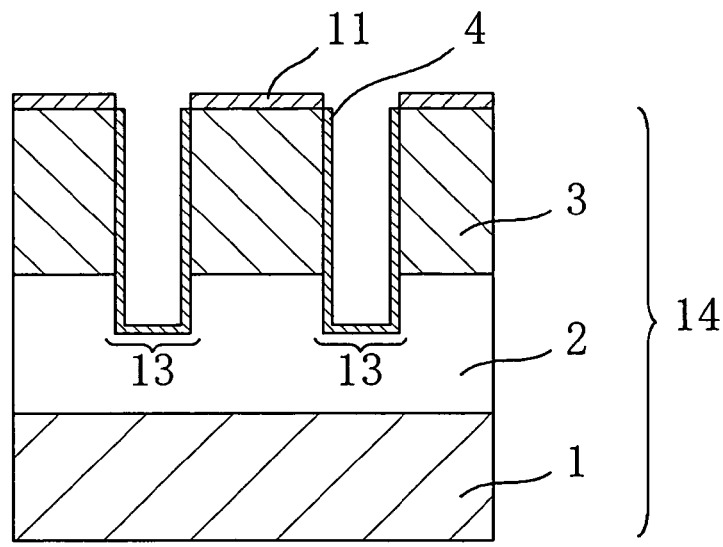

Next, in the step shown in FIG. 3B, a gate insulating film 4 of 20 to 30 nm in thickness made of, for example, a silicon oxide film is formed on the surface of the trench 13. It is noted that it is possible that a sacrificial oxide film is formed for removing the surface roughness of the trench 13 before the gate insulating film 4 is formed, and then, the sacrificial oxide film is removed by wet etching.

Figure 3C:
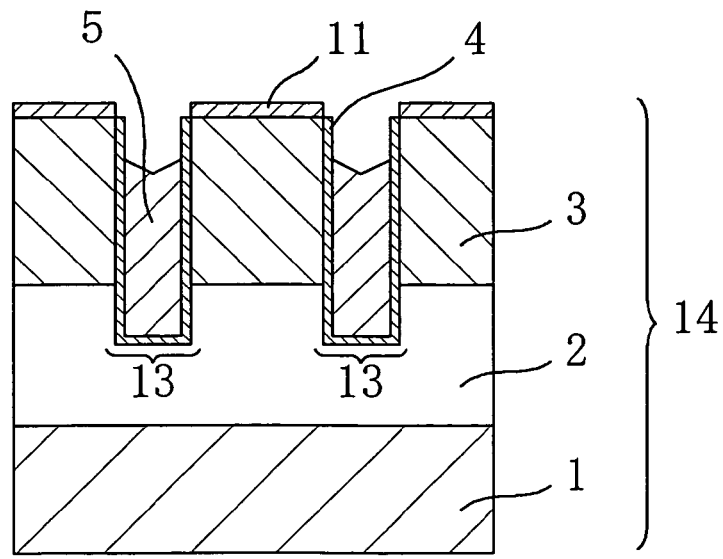

Subsequently, in the step shown in FIG. 3C, a polysilicon film (not shown) of 400 nm in thickness, which is to be a gate electrode, is deposited on the substrate so as to fill the trench 13. In this deposition, in order to lower the resistance of the polysilicon film, a doped polysilicon film is deposited beforehand or a non-doped polysilicon film is deposited, and then, an impurity is diffused. Then, the polysilicon film is etched back to remove a part located on the upper surface of the semiconductor region 14 and an upper part of a part located in the trench 13 in the polysilicon film, thereby forming a gate electrode 5 in the trench 13. In this formation, it is desirable that the amount of etch back from the surface of the semiconductor region 14 to the upper surface of the gate electrode 5 is in the range between about 200 and about 500 nm.

Figure 4A:
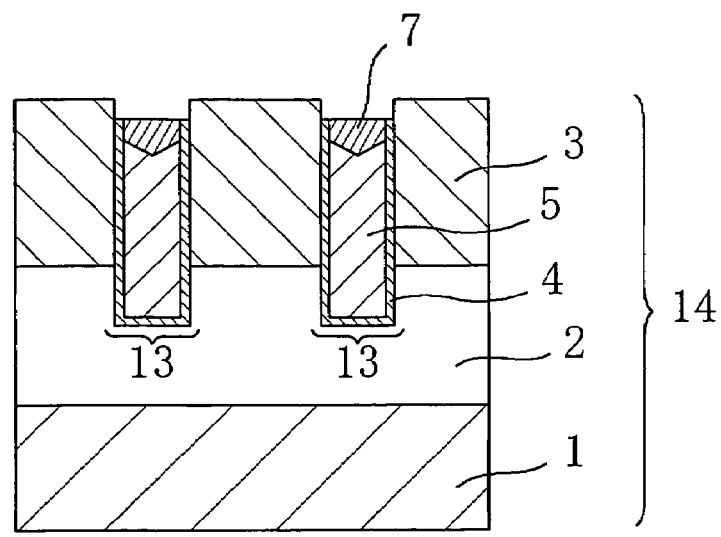
FIG. 4A to FIG. 4C are sections respectively showing steps of the fabricating method of the semiconductor device according to the first embodiment of the present invention.

Next, in the step shown in FIG. 4A, a silicon oxide film (NSG (Non Silicate Glass) film, not shown) including no impurity and having a thickness of about 500 nm is formed on the entire surface of the substrate by, for example, CVD (chemical vapor deposition). Then, etching is performed to the silicon oxide film for a predetermined period of time to form a buried insulating film 7 made of the silicon oxide film in the trench 13. In this formation, it is desirable that the amount of etch back from the upper surface of the semiconductor region 14 to the upper surface of the buried insulating film 7 is in the range between about 0 and about 120 nm. In this etching, a part where the gate insulating film 4 is exposed at the upper part of the trench 13 is also removed, so that the level of the upper end of the gate insulating film 4 becomes equal to the level of the upper surface of the buried insulating film 7. Further, the mask material 11 (shown in FIG. 3C) remaining on the upper surface of the semiconductor region 14 is also removed. As a result, the N-type body region 3 is exposed at the upper surface thereof and at the upper part of the side surface of the trench 13. It is noted that the mask material 11 may be removed selectively after removal of the silicon oxide film and the gate insulating film 4.

Subsequently, in the step shown in FIG. 4B, after a resist (not shown) having an opening at a part corresponding to a source formation region is formed on the substrate, boron, which is a P-type impurity, is implanted to the N-type body region 3 under the conditions of implantation energy at 80 KeV and does amount of $4\times10^{15}$ ions/cm$^2$ to form a first high concentration P-type source region 6 of, for example, 1.1 μm in diffusion depth. Successively, boron, which is a P-type impurity, is implanted under the conditions of implantation energy at 60 KeV and dose amount of $4\times10^{15}$ ions/cm$^2$ to form a second high concentration P-type source region 8 of, for example, 150 nm in diffusion depth. In the second implantation, the second high concentration P-type source region 8 is formed so that the peak of the impurity concentration of the second high concentration P-type source region 8 is located hither than the upper surface of the buried insulating film 7. It is noted that either the first high concentration P-type source region 6 or the second high concentration P-type source region 8 may be formed first. Thereafter, though not shown in FIG. 4B, a resist having an opening at a part corresponding to a body contact formation region is formed on the substrate, and then, phosphorous, which is a N-type impurity, is implanted under the conditions of implantation energy at 120 KeV and dose amount of $5\times10^{15}$ ions/cm$^2$ to form a high concentration N-type diffusion region 9 as shown in FIG. 1.

Figure 4B:
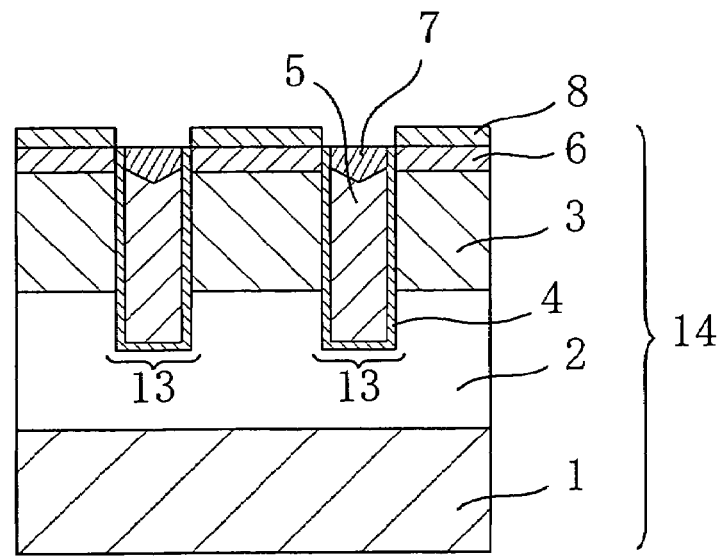
Figure 4C:
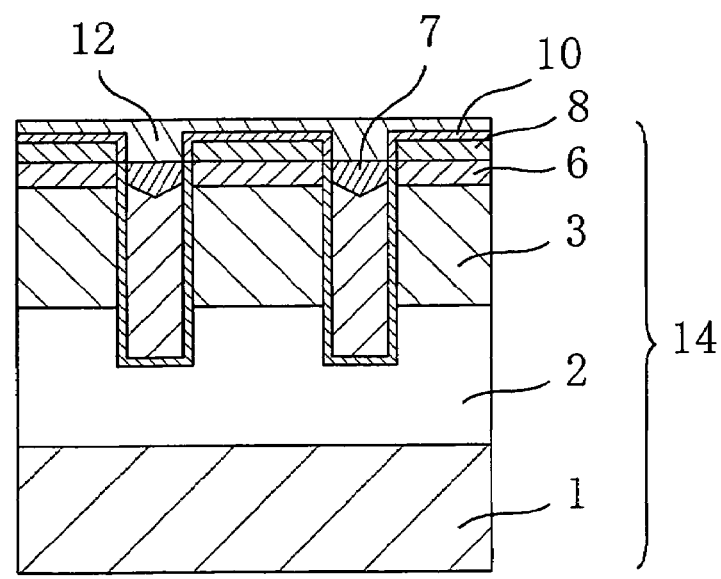

Next, in the step shown in FIG. 4C, a silicide film 10 is selectively formed on the entire surface portion where the semiconductor region 14 is exposed (including a part exposed at the side surface of the trench 13) by a salicide technique. Whereby, the silicide film 10 is formed on the second high concentration P-type source region 8 and the high concentration N-type diffusion region 9 (see FIG. 1). Then, after a metal film (not shown) is formed on the substrate, the metal film is patterned to form a source electrode film 12 on the silicide film 10 and the buried insulating film 7.

In the above construction, the source region is formed using the two kinds of acceleration voltage. In other words: the junction depth between the source region and the body region is controlled by the first implantation for forming the first high concentration P-type source region 6, thereby avoiding offset between the source and the gate; and the impurity concentration in the vicinity of the upper surface of the semiconductor region 14 is increased by the second implantation for forming the second high concentration P-type source region 8, thereby realizing an excellent ohmic contact between the silicide film 10 and the second high concentration P-type source region 8. With a synergetic effect of these two effects, a semiconductor device having a lower resistance than a conventioanl one can be obtained.

Second Embodiment

A semiconductor device according to the second embodiment of the present invention and a fabricating method thereof will be described below with reference to drawings.

The present embodiment is different from the first embodiment in impurity distribution of the source region and the formation method thereof. Therefore, the construction on plane and the construction in section of the semiconductor device in the present embodiment are basically the same as those in the first embodiment respectively shown in FIG. 1A and FIG. 1B.

Figure 5A:
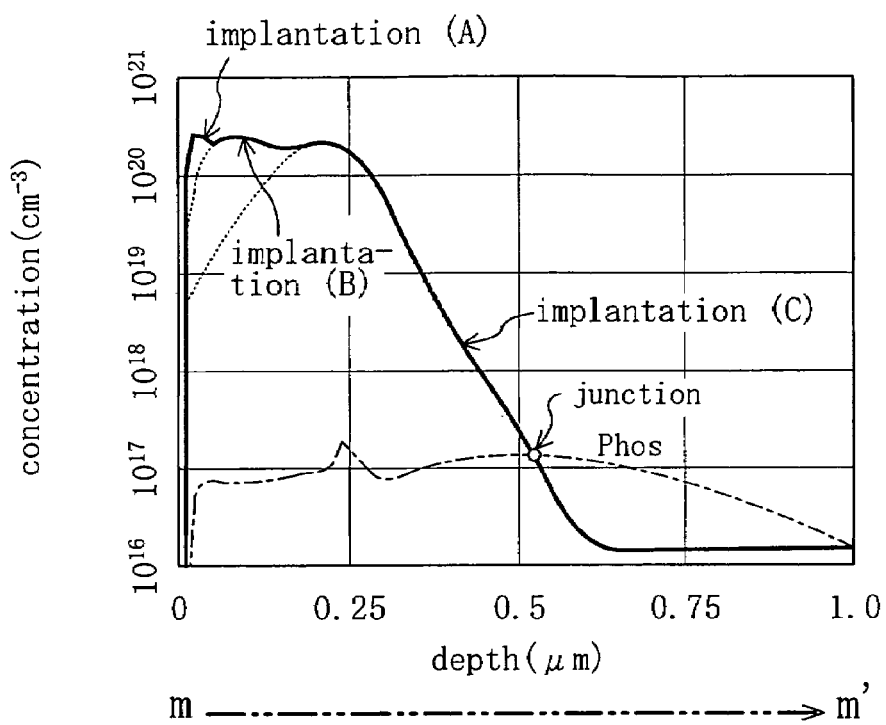
FIG. 5A is a graph illustrating impurity distribution (second embodiment) along the line m-m' in FIG. 1B.
Figure 5B:
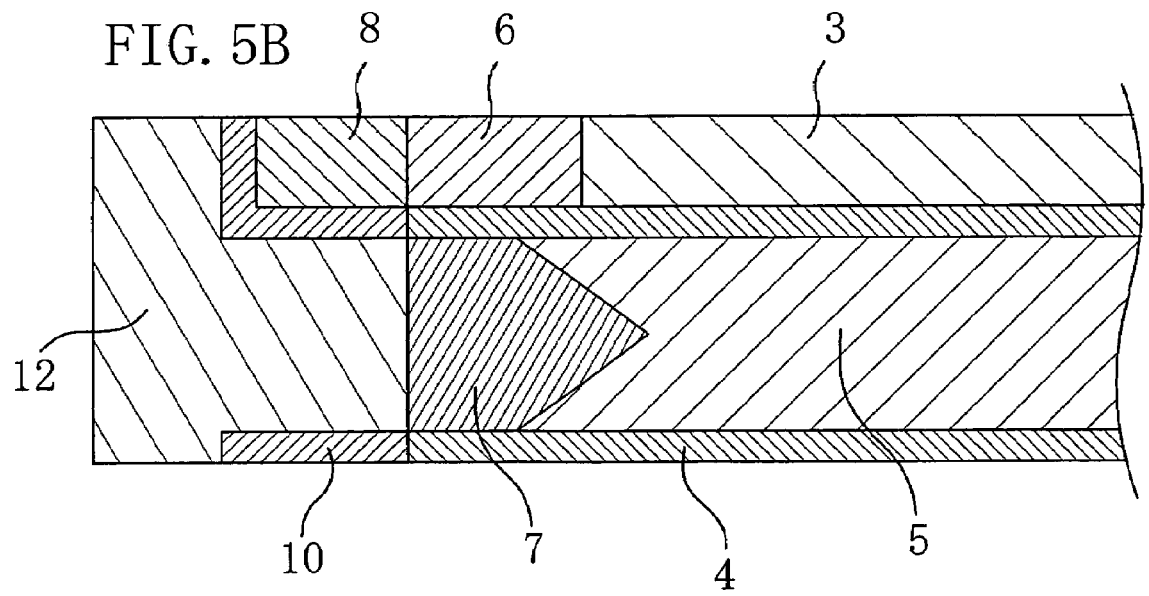
FIG. 5B is a section showing, in an enlarged scale, a structure in the vicinity of the line m-m' in FIG. 1B.

FIG. 5A shows impurity distribution along the line m-m' shown in FIG. 1B in the present embodiment, and FIG. 5B is a section in an enlarged scale showing a structure in the vicinity of the line m-m' shown in FIG. 1B. It is noted that impurity distributions obtained by the two-time ion implantation correspond respectively to the first high concentration P-type source region 6 and the second high concentration P-type source region 8 in the first embodiment, but the impurity distribution in the present embodiment does not correspond specifically to the first high concentration P-type source region 6 and the second high concentration P-type source region 8. Namely, in the present embodiment, the source region are formed by three or more time ion implantation, wherein a part of the thus formed source region which is located lower than the upper end (upper surface) of the buried insulating film 7 serves as the first high concentration P-type source region 6 and a part of the thus formed source region which is located upper than the upper end (upper surface) of the buried insulating film 7 serves as the second high concentration P-type source region 8. Further, the end part of the bottom surface of the buried insulating film 7, that is, a part thereof in contact with the gate insulating film 4 is located upper than the interface of the first high concentration P-type source region 6 and the N-type body region 3 also in the present embodiment.

One of the significant features of the present embodiment lies in that, as shown in FIG. 5A, the impurity concentration of the second high concentration P-type source region 8, that is, the impurity concentration of a region of the source region which ranges from the upper end of the buried insulating film 7 to the upper surface of the semiconductor region 14 is set to be over $1\times10^{20}$ atoms/cm$^3$. The peak of the impurity concentration of the source region composed of the first high concentration P-type source region 6 and the second high concentration P-type source region 8 appears at a part upper than the upper end of the buried insulating film 7, namely, within the level range of the height of the source electrode film 12 in the trench 13.

In order to obtain the impurity distribution as shown in FIG. 5A, for example, following ion implantation is performed in the present embodiment in the step shown in FIG. 4B in the first embodiment. Namely: boron, which is a P-type impurity, is implanted (implantation (A)) under the conditions of implantation energy at 4 KeV and dose amount of $4\times10^{15}$ ions/cm$^2$; boron is implanted (implantation (B)), as well, under the conditions of implantation energy at 20 KeV and dose amount of $4\times10^{15}$ ions/cm$^2$; and then, boron is implanted (implantation (C)), as well, under the conditions of implantation energy at 60 KeV and dose amount of $4\times10^{15}$ ions/cm². Wherein, the semiconductor device fabricating method in the present embodiment is the same as that of the first embodiment, except the step shown in FIG. 4B, that is, the source region formation step. The impurity concentration shown in FIG. 5A is impurity concentration of an impurity to be activated by annealing out of implanted impurities. In addition, in FIG. 5A, Phos (dot-and-dash line) indicates a concentration of a N-type impurity (phosphorous) that has been implanted before the boron implantation. Further, the order of the implantation (A), (B) and (C) to be performed is not specifically limited in the present embodiment. The junction shown in FIG. 5A is formed by the implantation (C).

Figure 6:
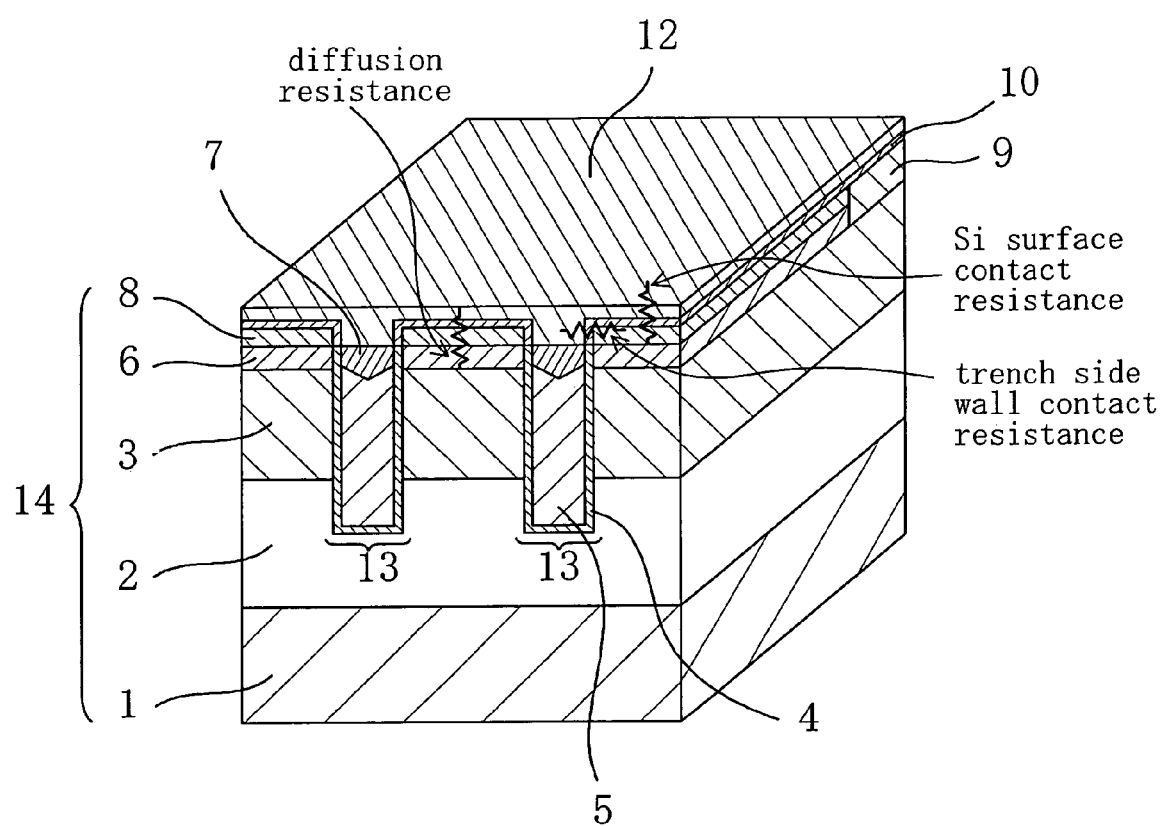
FIG. 6 is a view for explaining effects obtained in the semiconductor device according to the second embodiment of the present invention.

The effects obtained in the present embodiment will be described below with reference to FIG. 6 and FIG. 7. FIG. 6 schematically shows the detail of resistances Rs caused in the source region, and FIG. 7 shows influence of the aforementioned three-time ion implantation (A) to (C) on the drain current in the case, as a standard, where a complete ohmic contact is formed between the source electrode film and the source region.

Figure 7:
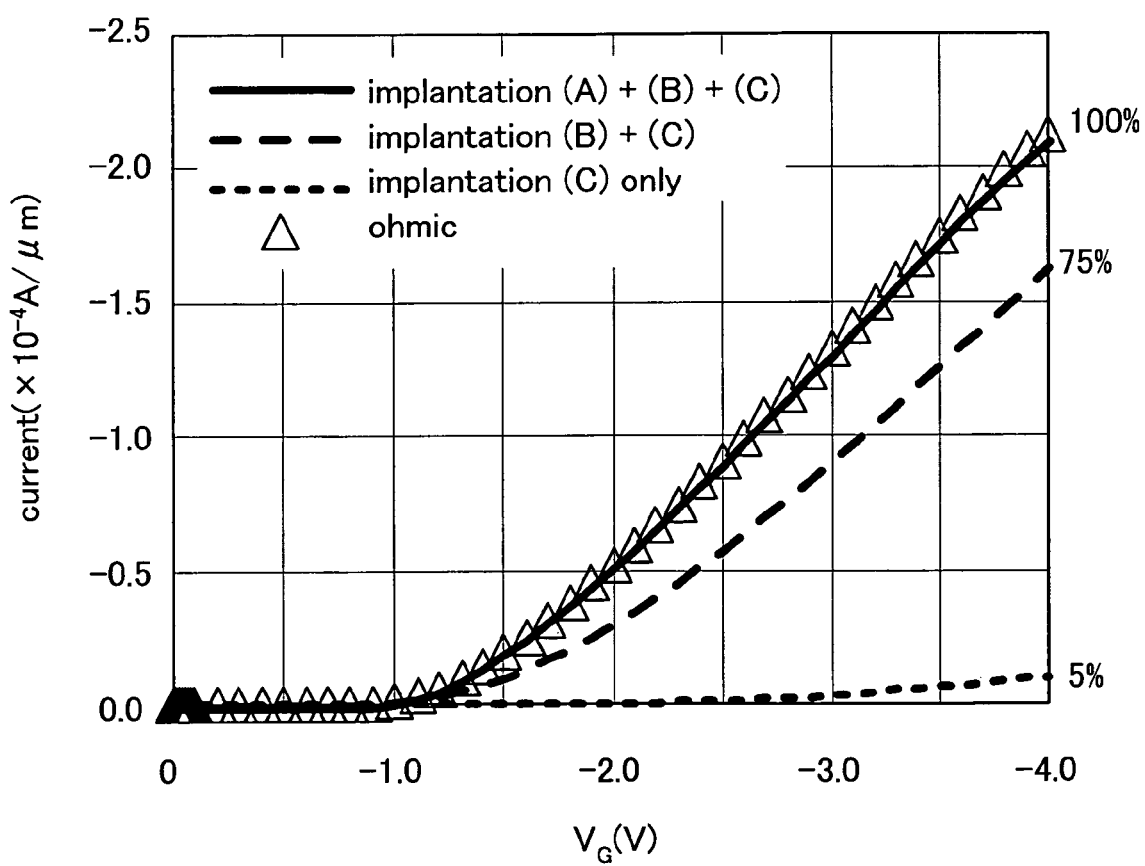
FIG. 7 is a graph for explaining effects obtained in the semiconductor device according to the second embodiment of the present invention.

As shown in FIG. 7, the source region formation by three-time ion implantation (A) to (C) attains an excellent characteristic equivalent to that of the ohmic contact. In contrast, the characteristic is degraded as the number of times of ion implantation is reduced. This might be because the implantation (B) reduces the contact resistance at the side wall of the trench shown in FIG. 6 and the implantation (A) reduces the contact resistance at the Si surface shown in FIG. 6.

In other words, the formation of the source region by three or more time ion implantation diffuses the impurity to a region far down from the upper surface of the semiconductor region 14 and increases the impurity concentration in the vicinity of the upper surface of the semiconductor region 14. Thus, the source region and the gate electrode 5 can overlap with each other surely, thereby preventing offset between the gate and the source. Further, a semiconductor device having an excellent ohmic contact between the source electrode film 12 provided on the source region and the source region can be obtained. With a synergetic effect of the two effects, a semiconductor device having further lower resistance can be obtained.

It is noted that the P-channel MIS transistor is referred to as one example in the first and second embodiments, but the present invention is applicable to N-channel MIS transistors and the same effects can be obtained in such a case.

Figure 8:
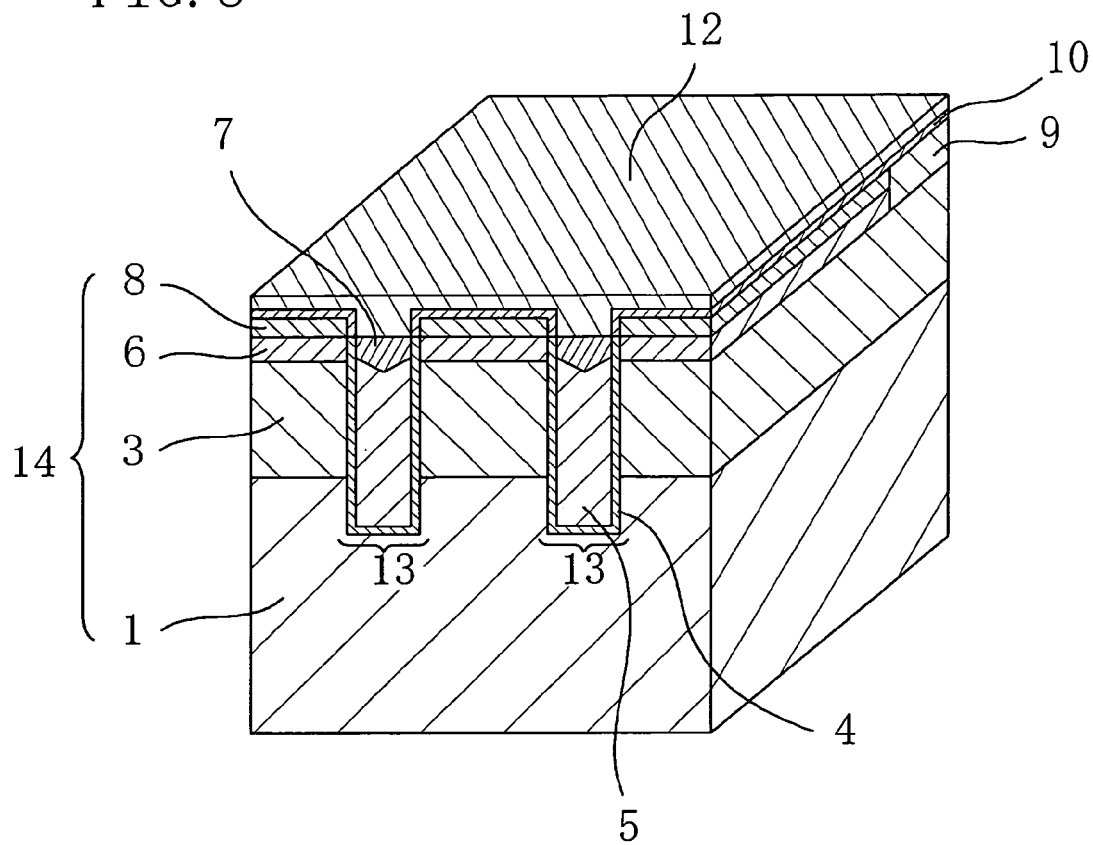
FIG. 8 is a schematic perspective view presenting a modification of the semiconductor device according to the first and second embodiments of the present invention.

The drain region includes the high concentration P-type drain region 1 and the low concentration P-type drain region 2 provided on the high concentration P-type drain region 1 in the first and second embodiments, but the low concentration P-type drain region 2 may not be formed instead, as shown in FIG. 8.

Figure 9:
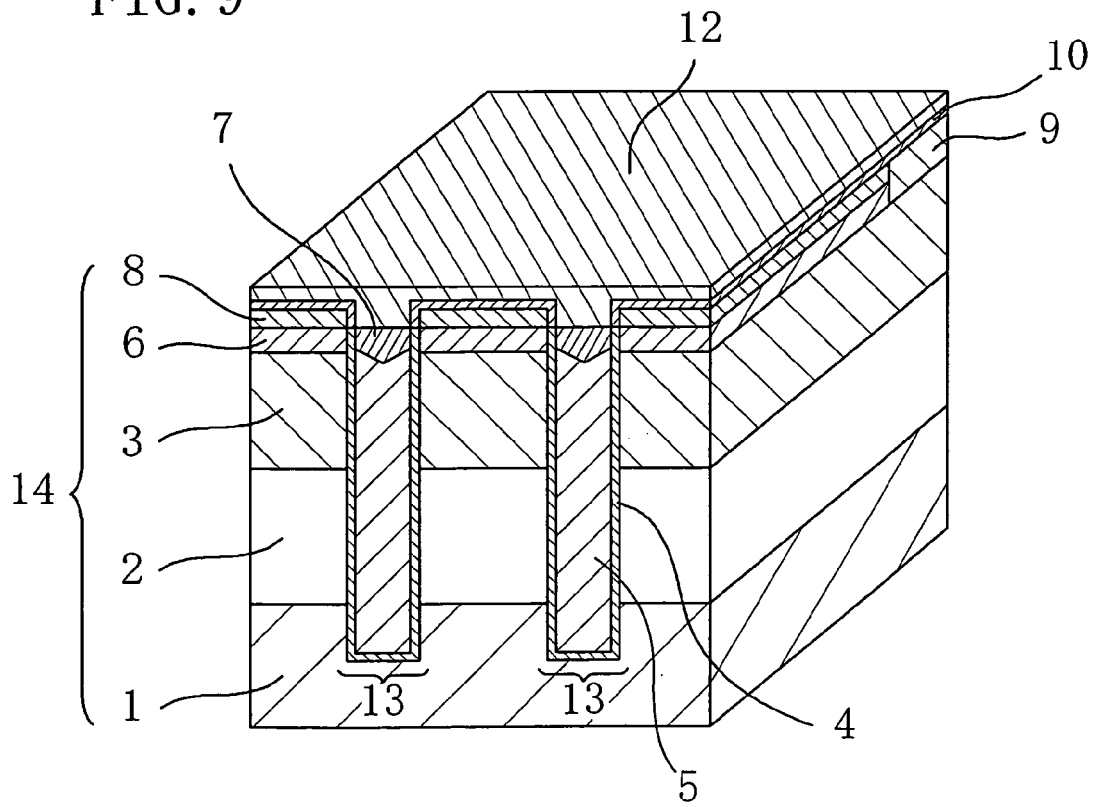
FIG. 9 is a schematic perspective view presenting a modification of the semiconductor device according to the first and second embodiments of the present invention.

In addition, each trench 13 is formed in the semiconductor region 14 so as to pass through the second high concentration P-type source region 8, the first high concentration P-type source region 6 and the N-type body region 3 and to reach a part at a predetermined depth of the low concentration P-type drain region 2. However, as shown in FIG. 9, it is possible that each trench 13 is formed in the semiconductor region 14 so as to pass through the second high concentration P-type source region 8, the first high concentration P-type source region 6, the N-type body region 3 and the low concentration P-type drain region 2 and to reach a part at a predetermined depth of the high concentration P-type drain region 1. In this case, also, the low concentration P-type drain region 2 may not be formed as shown in FIG. 10.

Figure 10:
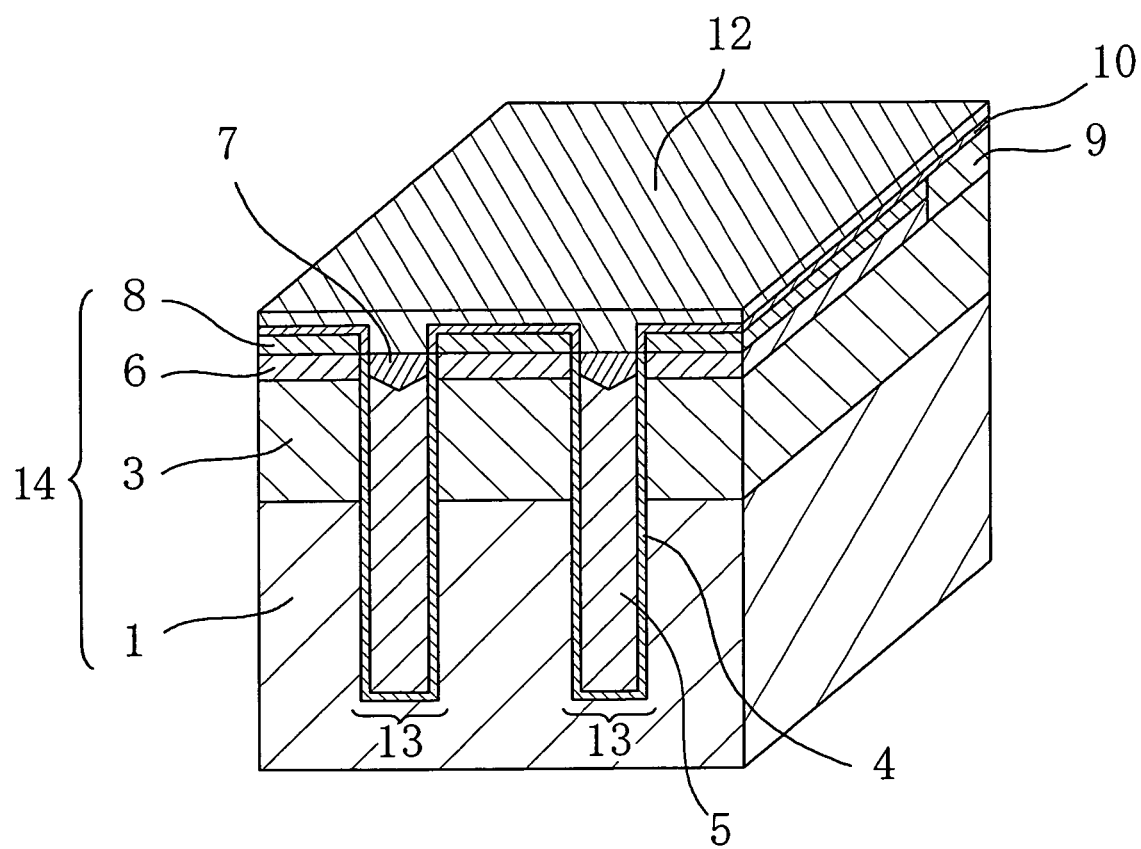
FIG. 10 is a schematic perspective view presenting a modification of the semiconductor device according to the first and second embodiments of the present invention.
Figure 11A:
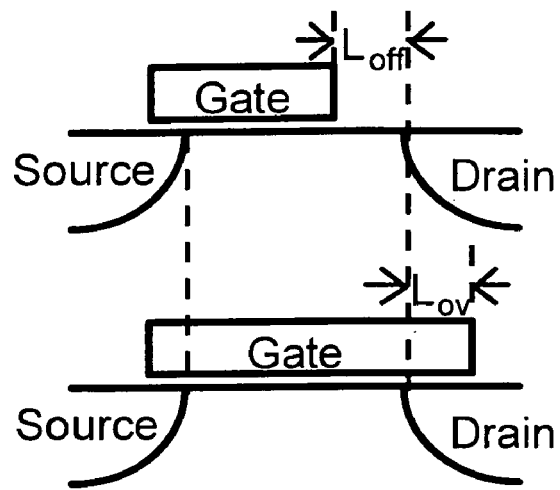
FIG. 11A and FIG. 11B are drawing for explaining effects obtained in the constructions shown in FIG. 9 and FIG. 10.
Figure 11B:
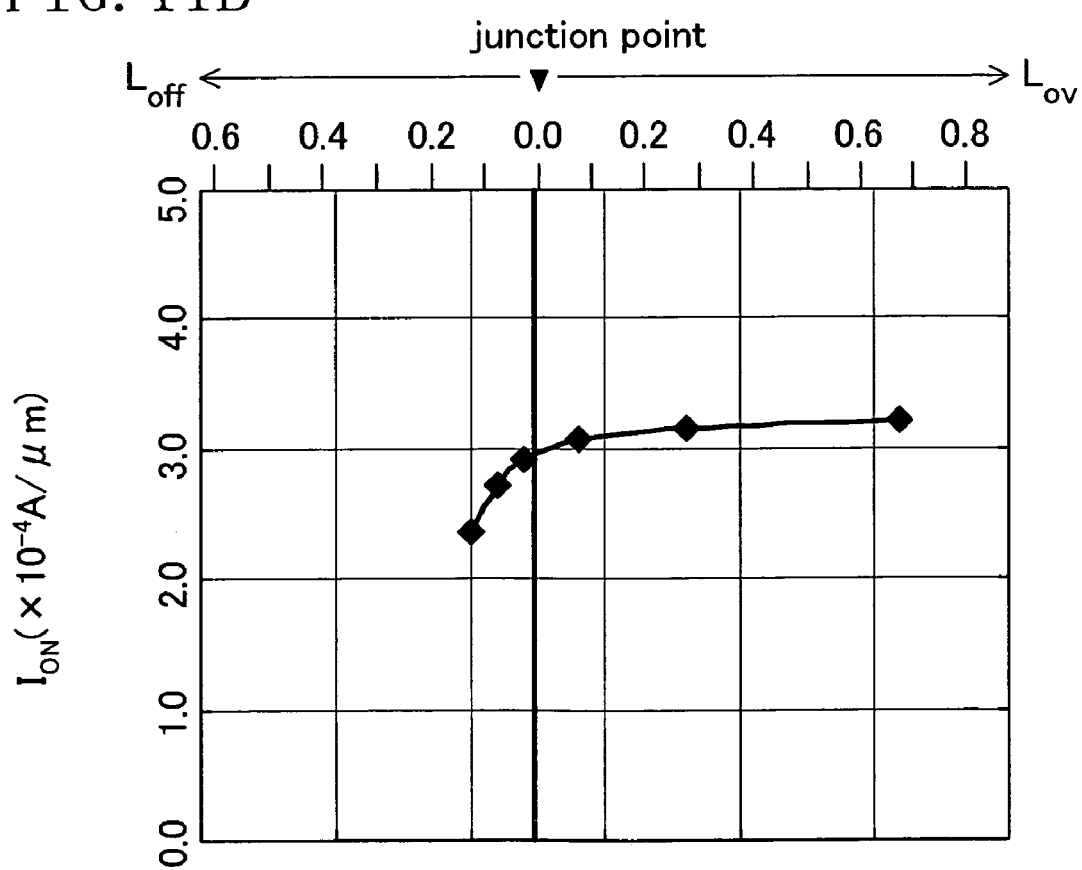
Figure 12:
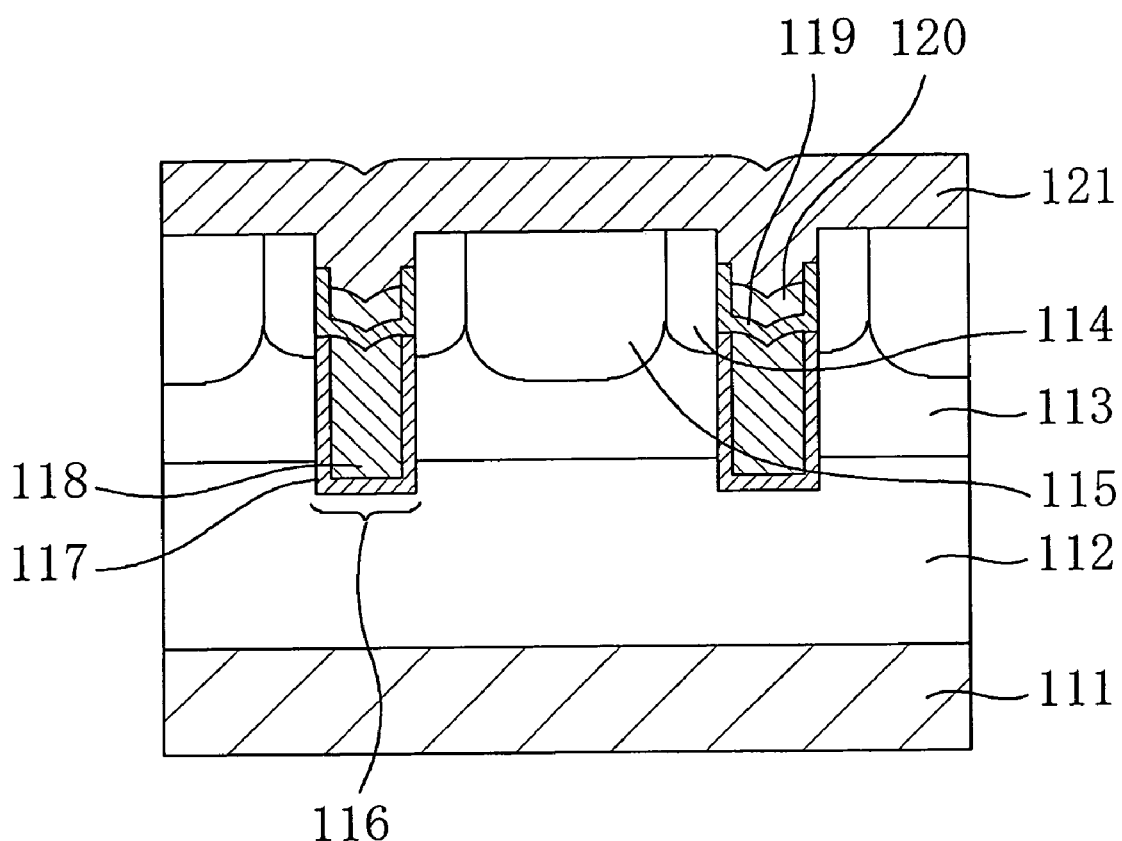
FIG. 12 is a section showing a semiconductor device having a conventional trench gate MISFET.

FIG. 11A and FIG. 11B are drawings for explaining the effects obtained in the constructions shown in FIG. 9 and FIG. 10. Namely, as shown in FIG. 11A and FIG. 11B, if the trench 13 is formed deep inside so as to increase the overlap amount Lov between the gate electrode and the drain region, the ON current Ion is also increased. To the contrary, if the trench 13 is formed shallowly and the overlap amount Lov between the gate electrode and the drain region is less or offset (offset amount: Loff) is caused between the gate electrode and the drain region, the ON current Ion is reduced.

What is claimed is:

1. A semiconductor device, comprising:
    a semiconductor region;
    a first conductivity type drain region provided in a lower part of said semiconductor region;
    a second conductivity type body region provided on said drain region in said semiconductor region;
    a first conductivity type first source region provided on said body region in said semiconductor region;
    a first conductivity type second source region provided on said first source region in said semiconductor region so as to extend to an upper surface of said semiconductor region;
    a trench formed in said semiconductor region and reaching said drain region;
    a gate insulating film provided at least on a side surface of said trench;
    a gate electrode provided on said gate insulating film in said trench; and
    an insulating film covering an upper surface of said gate electrode in said trench,
    wherein an upper end of said insulating film is located lower than an upper surface of said semiconductor region.

2. The semiconductor device of claim 1, wherein
    said drain region includes: a first conductivity type high concentration drain region; and a first conductivity type low concentration drain region provided on said high concentration drain region.

3. The semiconductor device of claim 2, wherein
    an impurity concentration of said high concentration drain region is over about $1\times10^{19}$ atoms/cm³ and,
    an impurity concentration of said low concentration drain region is below about $5\times10^{16}$ atoms/cm³.

4. The semiconductor device of claim 2, wherein said trench is formed so as to reach said low concentration drain region.

5. The semiconductor device of claim 1, further comprising:
    a source electrode provided above said second source region.

6. The semiconductor device of claim 5, wherein
    said source electrode is provided at a part above said second source region and on a part where said second source region is exposed at the side surface of said trench.

7. The semiconductor device of claim 5, wherein
    a silicide film is provided between said second source region and said source electrode.

8. The semiconductor device of claim 5, wherein
a peak of impurity concentration of said second source region appears within a level range of a height of said source electrode provided on the side surface of said trench.

9. The semiconductor device of claim 1, wherein
an upper end of a part where said gate electrode is in contact with said gate insulating film is located upper than a boundary between said first source region and said body region.

10. The semiconductor device of claim 1, wherein
an upper end of said insulating film is located lower than a peak of impurity concentration of said second source region.

11. The semiconductor device of claim 1, wherein
a second conductivity type impurity region in contact with said body region is provided in a region located on respective sides of said first source region and said second source region in said semiconductor region, and
respective side surfaces of said first source region and said second source region are surrounded by said trench and said impurity region.

12. The semiconductor device of claim 1, wherein
a peak of impurity concentration of said first source region is located lower than that of said second source region.

13. The semiconductor device of claim 1, wherein
said second source region has a peak of impurity concentration higher than said first source region.

14. A semiconductor device, comprising:
a semiconductor region;
a first conductivity type drain region provided in a lower part of said semiconductor region;
a second conductivity type body region provided on said drain region in said semiconductor region;
a first conductivity type source region provided on said body region in said semiconductor region so as to extend to an upper surface of said semiconductor region;
a trench formed in said semiconductor region and reaching said drain region;
a gate insulating film provide on at least a side surface of said trench;
a gate electrode provided on said gate insulating film in said trench; and
an insulating film covering an upper surface of said gate electrode in said trench,
wherein an upper end of said insulating film is located lower than the upper surface of said semiconductor region, and
an impurity concentration of a part of said source region from the upper end of said insulating film to the upper surface of said semiconductor region is equal to or larger than $1 \times 10^{20}$ atoms/cm$^3$.

15. The semiconductor device of claim 14, wherein
said drain region includes: a first conductivity type high concentration drain region; and a first conductivity type low concentration drain region provided on said high concentration drain region.

16. The semiconductor device of claim 15, wherein said trench is formed so as to reach said low concentration drain region.

17. The semiconductor device of claim 14, further comprising:
a source electrode provided above said second source region.

18. The semiconductor device of claim 17, wherein
said source electrode is provided at a part above said source region and on a part where said source region is exposed at the side surface of said trench.

19. The semiconductor device of claim 17, wherein a silicide film is provided between said source region and said source electrode.

20. The semiconductor device of claim 17, wherein
a peak of impurity concentration of said source region appears within a level range of a height of said source electrode provided on the side surface of said trench.

21. The semiconductor device of claim 14, wherein
an upper end of a part where said gate electrode is in contact with said gate insulating film is located upper than a boundary between said source region and said body region.

22. The semiconductor device of claim 14, wherein
the upper end of said insulating film is located lower than a peak of impurity concentration of said source region.

23. The semiconductor device of claim 14, wherein
a second conductivity type impurity region in contact with said body region is provided in a region located on a side of said source region in said semiconductor region, and
a side surface of said source region is surrounded by said trench and said impurity region.

24. The semiconductor device of claim 14, wherein said source region is formed by three or more time ion implantation.

25. A semiconductor device, comprising:
a semiconductor region;
a first conductivity type drain region provided in a lower part of said semiconductor region;
a second conductivity type body region provided on said drain region in said semiconductor region;
a first conductivity type first source region provided on said body region in said semiconductor region;
a first conductivity type second source region provided on said first source region in said semiconductor region so as to extend to an upper surface of said semiconductor region;
a trench formed in said semiconductor region and reaching said drain region;
a gate insulating film provided at least on a side surface of said trench;
a gate electrode provided on said gate insulating film in said trench;
an insulating film covering an upper surface of said gate electrode in said trench; and
a source electrode provided above said second source region,
wherein said source electrode is provided at a part above said second source region and on a part where said second source region is exposed at the side surface of said trench.

26. A semiconductor device, comprising:
a semiconductor region;
a first conductivity type drain region provided in a lower part of said semiconductor region;
a second conductivity type body region provided on said drain region in said semiconductor region;
a first conductivity type first source region provided on said body region in said semiconductor region;
a first conductivity type second source region provided on said first source region in said semiconductor region so as to extend to an upper, surface of said semiconductor region;

a trench formed in said semiconductor region and reaching said drain region;
a gate insulating film provided at least on a side surface of said trench;
a gate electrode provided on said gate insulating film in said trench; and
an insulating film covering an upper surface of said gate electrode in said trench,
wherein an upper end of a part where said gate electrode is in contact with said gate insulating film is located upper than a boundary between said first source region and said body region.

27. A semiconductor device, comprising:
a semiconductor region;
a first conductivity type drain region provided in a lower part of said semiconductor region;
a second conductivity type body region provided on said drain region in said semiconductor region;
a first conductivity type first source region provided on said body region in said semiconductor region;
a first conductivity type second source region provided on said first source region in said semiconductor region so as to extend to an upper surface of said semiconductor region;
a trench formed in said semiconductor region and reaching said drain region;
a gate insulating film provided at least on a side surface of said trench;
a gate electrode provided on said gate insulating film in said trench; and
an insulating film covering an upper surface of said gate electrode in said trench,
wherein a second conductivity type impurity region in contact with said body region is provided in a region located on respective sides of said first source region and said second source region in said semiconductor region, and
respective side surfaces of said first source region and said second source region are surrounded by said trench and said impurity region.

28. A semiconductor device, comprising:
a semiconductor region;
a first conductivity type drain region provided in a lower part of said semiconductor region;
a second conductivity type body region provided on said drain region in said semiconductor region;
a first conductivity type first source region provided on said body region in said semiconductor region;
a first conductivity type second source region provided on said first source region in said semiconductor region so as to extend to an upper surface of said semiconductor region;
a trench formed in said semiconductor region and reaching said drain region;
a gate insulating film provided at least on a side surface of said trench;
a gate electrode provided on said gate insulating film in said trench; and
an insulating film covering an upper surface of said gate electrode in said trench,
wherein a peak of impurity concentration of said first source region is located lower than that of said second source region.

29. A semiconductor device, comprising:
a semiconductor region;
a first conductivity type drain region provided in a lower part of said semiconductor region;
a second conductivity type body region provided on said drain region in said semiconductor region;
a first conductivity type first source region provided on said body region in said semiconductor region;
a first conductivity type second source region provided on said first source region in said semiconductor region so as to extend to an upper surface of said semiconductor region;
a trench formed in said semiconductor region and reaching said drain region;
a gate insulating film provided at least on a side surface of said trench;
a gate electrode provided on said gate insulating film in said trench;
an insulating film covering an upper surface of said gate electrode in said trench; and
a source electrode provided above said second source region,
wherein a peak of impurity concentration of said second source region appears within a level range of a height of said source electrode provided on the side surface of said trench.

* * * * *